US006899597B2

(12) United States Patent
Wrschka et al.

(10) Patent No.: US 6,899,597 B2
(45) Date of Patent: May 31, 2005

(54) CHEMICAL MECHANICAL POLISHING (CMP) PROCESS USING FIXED ABRASIVE PADS

(75) Inventors: Peter Wrschka, Danbury, CT (US); Alexander Simpson, Warrenville, IL (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/353,733

(22) Filed: Jan. 29, 2003

(65) Prior Publication Data

US 2005/0014454 A1 Jan. 20, 2005

(51) Int. Cl.[7] .................................................. B24B 1/00
(52) U.S. Cl. ......................................... 451/41; 451/60
(58) Field of Search ............................... 451/41, 36, 60; 438/691, 692, 693

(56) References Cited

U.S. PATENT DOCUMENTS

| 5,972,792 | A | * | 10/1999 | Hudson ..................... 438/691 |
| 6,083,419 | A | * | 7/2000 | Grumbine et al. ......... 252/79.1 |
| 6,211,087 | B1 | * | 4/2001 | Gabriel et al. ............. 438/691 |
| 6,268,293 | B1 | | 7/2001 | Clevenger et al. |
| 6,303,401 | B2 | | 10/2001 | Nichterwitz et al. |
| 6,419,554 | B2 | * | 7/2002 | Chopra et al. ................ 451/41 |
| 6,461,226 | B1 | | 10/2002 | Yi |
| 6,468,897 | B1 | | 10/2002 | Cheng et al. |
| 6,478,659 | B2 | | 11/2002 | Peng et al. |
| 6,479,898 | B1 | | 11/2002 | Hopper et al. |
| 2002/0123299 | A1 | * | 9/2002 | Chopra et al. ................ 451/36 |
| 2002/0168923 | A1 | * | 11/2002 | Kaufman et al. ............. 451/36 |

OTHER PUBLICATIONS

Kyoung–Jun Kim et al., "CMP Characteristics According to Slurry Injection Position," SemiWorld Journal. vol. 2 http://www.semiworld.com/sub_en/journal_en/journal0002_2_en.php 3.

Ho–Youn Kim et al., "Development of an Semi–Rigid Abrasive Pad for Chemical Mechanical Polishing," Semi-World Journal vol. 2, http://www.semiworld.com/sub_en/journal_en/journal0002_3_en.php3.

Hyoung–Jae Kim et al., "Viscoelastic Behavior of Polishing Pad and Its Influence on Polishing Non–uniformity," Semi-World Journal vol. 12, http://www.semiworld.com/sub_en/journal_en/journal0002_4_en.php3.

* cited by examiner

Primary Examiner—Dung Van Nguyen
(74) Attorney, Agent, or Firm—Slater & Matsil, L.L.P.

(57) ABSTRACT

A semiconductive wafer having a layer of conductive material formed thereon is polished. The semiconductor wafer is rotated against an abrasive polishing pad. A solution is applied to the semiconductor wafer and to the abrasive polishing pad. The solution includes an etchant of the conductive material.

19 Claims, 4 Drawing Sheets

CHEMICAL MECHANICAL POLISHING (CMP) PROCESS USING FIXED ABRASIVE PADS

BACKGROUND OF THE INVENTION

The present invention is directed to processes for the fabrication of semiconductor integrated circuit devices and, more particularly, to the formation of metal interconnections used in semiconductor integrated circuit devices.

As semiconductor device features shrink and the number of wiring layers increases, irregularities of any size in the surface of a respective layer translate to the subsequently deposited, overlying layers and create even greater irregularities in the surfaces of the overlying layers. The surface irregularities distort the heights and shapes of any features formed on the surfaces of the overlying layers and make printing on and alignment of underlying to overlying layers more difficult. Often, the height variation in the surfaces of the overlying layers exceed the depth of focus of the photolithographic tools so that it is essentially impossible to print the intended features over the entire surface or to align a printing mask to previous levels.

To create an essentially flat or planar surface at each layer so that shapes are printed with high dimensional and geometric accuracy, planarization processes are employed. One such known planarization process is to employ a "damascene" process that uses chemical mechanical polishing (CMP). In the "damascene" process, one or more dielectric layers are deposited over the device dielectric layer, and openings are formed in the dielectric layers. A conductor material is deposited over the dielectric layer and in the openings. Chemical mechanical polishing is then employed to planarize the surface, namely to cause the top surface of the conductor material to be at the same height as the top surface of the dielectric layer, so that the conductor material is "inlaid" in the dielectric layer.

For a single level of interconnections, a "single damascene" process is used. A thin channel stop layer is deposited over a device dielectric layer and serves as an etch stop layer. A photoresist layer is then deposited on the first channel stop layer and photolithographically patterned, and the exposed portions of the first channel stop layer are then anisotropically etched to provide openings to the device contact regions. A channel dielectric layer is then formed atop the first channel stop layer. Typically, when one of the channel dielectric layer or the channel stop layer is an oxide material, such as silicon dioxide ($SiO_2$), the other one of the two layers is a nitride, such as silicon nitride (SiN), so that selective etching may be used. The channel dielectric layer is then subject to further photolithographic patterning and etching steps to form channel openings therein. A thin adhesion layer, such as tantalum nitride (TaN), titanium nitride (TiN) or tungsten nitride (WN), may then be deposited on the channel dielectric layer to line the channel openings or lines and ensure good adhesion of any subsequently deposited material to the channel dielectric layer.

A conductor material, such as copper (Cu), tantalum (Ta), titanium (Ti) or tungsten (W), is then formed over the channel dielectric layer and fills the openings in the channel dielectric layer. A chemical mechanical polishing step is then carried out to remove any portions of the conductor material that are above the top surface of the channel dielectric layer, thereby forming conductor lines in the channel dielectric layer, and to "planarize" the top surface of the two layers. A "capping" layer may then be deposited as a final layer.

Alternatively, for more complex devices, a "dual damascene" technique is employed. A via stop layer is deposited instead of the capping layer, and a via dielectric layer is then deposited atop the via stop layer. When either the via stop layer or the via dielectric layer is an oxide material, the other one of the two layers is a nitride material so that the two layers may be selectively etched.

Thereafter, a further channel stop layer and a further channel dielectric layer are formed atop the via dielectric layer. Again, when one of the further channel dielectric layer or the further channel dielectric layer is an oxide material, the other one is a nitride material so that the two layers can be selectively etched. The further channel dielectric layer, the further channel stop layer, the via dielectric layer and the via stop layer are then subject to further photolithographic processing and etching to form vias and further channel openings or lines in the layers. A thin adhesion layer may then be deposited on the further channel dielectric layer to line the further channel openings and the via openings. A barrier or liner layer is then deposited on the adhesion layer and lines the adhesion layer in the further channel openings and the vias. Next, a further conductor material is deposited over the channel dielectric layer and fills the further channel openings and the vias.

A CMP process is then employed to remove the part of the further conductor material and the barrier or liner layer that is above the further channel dielectric layer to form further conductor lines. A "capping" layer may then be formed over the further channel lines as a final layer. Alternatively, an etch stop layer is formed and further processing is carried out to form additional levels of conductor lines and vias. Individual and/or multiple levels of single and dual damascene structures may be formed for single and multiple levels of conductor lines and vias, also known as interconnects.

To carry out the above CMP processes, a conventional CMP apparatus typically includes a rotating table having a polishing pad disposed thereon and includes a wafer carrier that holds a wafer. The wafer is held by a platen in an inverted position against the polishing pad. A predetermined pressure is exerted on the wafer against the polishing pad, and a slurry is applied between the wafer and the polishing pad. In operation, the polishing pad and the wafer rotate in relation to one another. The wafer is polished by mechanical abrasion from the polishing pad and from particles in the slurry and by chemical action from the slurry on the polishing pad.

Apparatus for polishing semiconductor wafers are well known in the art. Typically, two polishing pads are used. The semiconductor wafer is first polished using a hard pad on a primary rotating table. The hard pad planarizes the wafer surface by removing the material on higher raised areas faster than in the lower areas. The wafer is then polished using the soft pad to remove any residual material or slurry residue on the wafer surface and to improve the uniformity of the wafer.

The known chemical mechanical polishing systems, however, have the disadvantage that the rate at which conductor material is removed is faster in higher pattern density regions, namely in regions with a higher density of conductor lines, than in lower pattern density regions. As a result, when all of the conductor material and liner layer that is atop the channel dielectric layer in the higher pattern density regions is removed, a portion of the conductor material that is atop the channel dielectric layer in the lower pattern density regions, as well as the liner layer, remains. To ensure that all of the conductor material and liner layer that is atop the channel dielectric layer in the lower pattern density regions is removed, the higher pattern density regions must be "overpolished." Furthermore, material removal during CMP is never completely uniform across the entire wafer, even for areas of the wafer that exhibit the same pattern density. Thus, some areas of the wafer need to be polished longer in comparison to other areas in order to remove all of the metal overburden. The overpolishing often removes a part of the conductor lines as well as some of the channel dielectric layer, an effect known as "dishing". The removal of the material from the conductor lines, however, is often undesirable because the electrical performance of the devices may be affected by the amount of conducting material in the conductor lines. Therefore, the CMP step must be of sufficient length to remove all of the overlying conductor material and liner layer in the lower pattern density regions but must be short enough to avoid excessive dishing in the higher density regions that would degrade electrical performance.

Newer generations of faster devices include conductor lines that are smaller and narrower and which are spaced more closely together in the higher density regions. The smaller and narrower lines and the increased line density further reduce the CMP process window between an inadequate removal of the conductor material in the lower pattern density regions and excessive dishing in the higher density regions. In some processes, the process window is eliminated altogether and results in complete removal of the conductor lines in some of the higher density regions, such as at the edge of the wafer. As a result, the devices in these regions are unusable, thereby reducing the process yield and increasing manufacturing costs.

It is therefore desirable to provide a chemical mechanical polishing process that completely removes the overlying conductor material and liner layer in the lower pattern density regions without avoid excessive dishing in the higher density regions.

SUMMARY OF THE INVENTION

The present invention addresses the above problems by providing a chemical mechanical polishing process that employs an abrasive pad in which abrasive particles are embedded and that uses a chemical solution containing metal etchants that is fed onto the wafer platen during the CMP process.

In accordance with an aspect of the invention, a semiconductor wafer having a layer of conductive material formed thereon is polished. The semiconductor wafer is rotated against an abrasive polishing pad. A solution is applied to the semiconductor wafer and to the abrasive polishing pad. The solution includes an etchant of the conductive material.

In accordance with a further aspect of the invention, a semiconductor device is fabricated on a semiconductor wafer. At least one dielectric layer is deposited atop a substrate, and the dielectric layer is patterned and etched to form one or more openings therein. A liner layer is deposited atop the dielectric layer and along a bottom and sidewalls of the opening. A conductor layer is deposited atop the liner layer that completely fills and extends above the opening. The conductor layer is polished to remove a portion of the conductive layer that extends outside the opening and to remove a portion of the conductive layer that extends above the opening. The polishing step includes rotating the semiconductor wafer against an abrasive polishing pad, and applying a solution to the semiconductor wafer and to the abrasive polishing pad. The solution includes an etchant of the conductive material.

The foregoing aspects, features and advantages of the present invention will be further appreciated when considered with reference to the following description of the preferred embodiments and accompanying drawings.

DETAILED DESCRIPTION

Figure 1A:
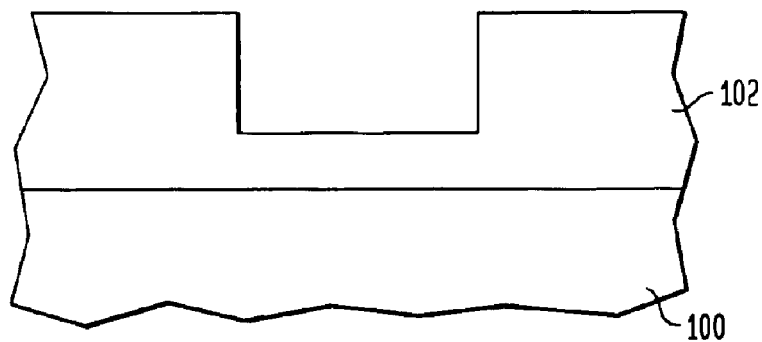
FIGS. 1A–1C are diagrams that illustrate the process steps of an existing Damascene process that includes a known Chemical Mechanical Polishing (CMP) step.
Figure 1B:
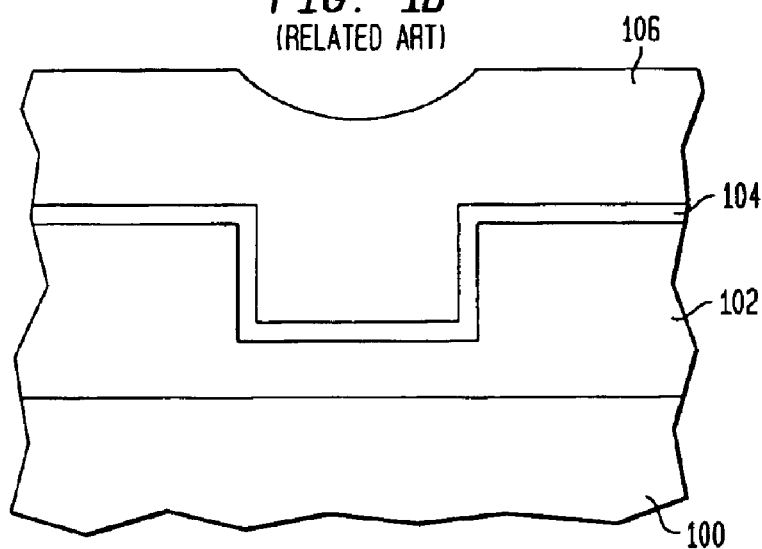
Figure 1C:
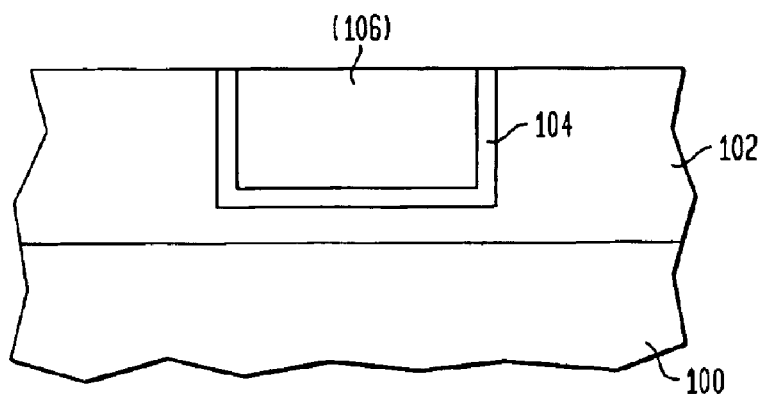

FIGS. 1A–1C illustrate the steps of a known Damascene process. First, as FIG. 1A shows, an insulating layer 102, such as silicon dioxide, is deposited atop a substrate 100. A resist layer (not shown) is then deposited atop the insulating layer and is exposed in a known manner, such as using photolithography, x-ray lithography, electron beam lithography, or ion beam lithography. The resist layer is then developed to either remove the exposed portions of the resist layer when positive resist is used or to remove the unexposed portions of the resist layer when negative resist is used. Then, the remaining portions of the resist are used to mask an etching step, such as using reactive ion etching (RIE), other plasma etching, or wet etching, to remove at least some of the exposed portions of the insulating layer 102.

Next, as FIG. 1B shows, a liner material 104 is deposited over the top surface of the insulating layer 102 as well as along the sidewalls and the bottom of the openings in the insulating layer. A conducting material 106, such as copper, is then deposited atop the liner material 104. The conducting material covers the top surface of the insulating layer and also fills the openings in the insulating layer and extends above the tops of the openings.

Thereafter, a chemical mechanical polishing (CMP) step is carried out to "planarize" the top surface of the wafer. The CMP step removes the portion of the conducting material that is deposited atop the insulating layer as well as the portion of the conducting material that extends above the tops of the openings in the insulating material so that a remaining portion of the conducting material fills only the openings in the insulating material 102. Preferably, the top surface of the remaining portion of the conducting material 104 is flush with the top surface of the insulating material 102. The CMP step may also remove the portion of the liner material 104 that was deposited atop the insulating material 102.

The known planarization process shown in FIGS. 1A–1C, however, does not always produce a uniform, planar surface across the entire device or across the entire wafer. Rather, as FIGS. 2A–2C show, the uniformity of the planarization is dependent upon the pattern density, namely the distance between the openings in the insulating layer.

Figure 2A:
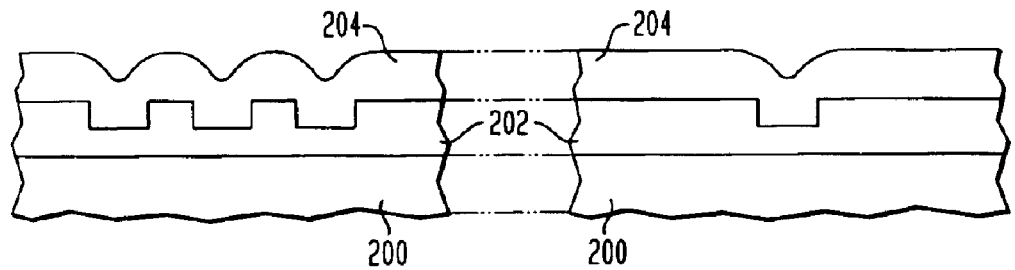
FIGS. 2A–2C are diagrams illustrating the effect of line pattern density on the planarized surface when a known CMP step is used.

FIG. 2A illustrates portions of a wafer where an insulating material 202 is deposited atop a substrate 200 and is patterned and etched in the known manner described above. A conducting layer 204 is deposited atop in the openings in the insulating layer. The left portion of FIG. 2A illustrates a region of higher pattern density in which, as an example, three closely spaced openings are formed in the insulating layer. The right portion of FIG. 2A, by contrast, illustrates a lower pattern density region. In the higher pattern density region, a greater portion of the conducting layer 204 is used to fill the openings in the insulating layer when compared to the lower pattern density region.

Figure 2B:
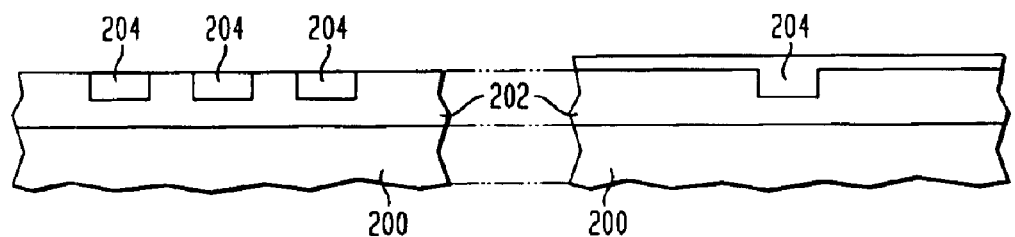

FIG. 2B shows the two regions of the wafer after a CMP step has removed all of the overlying conducting material in the higher pattern density region but not in the lower pattern density region. Because a greater portion of the conducting layer is used to fill openings in the higher pattern density region, the rate of planarization in the higher pattern density region is greater than that in the lower pattern density region. As a result, when the CMP step has removed all of the conducting layer that is atop the insulting layer in the higher pattern density region, shown in the left side of FIG. 2B, a thin layer of conducting material remains atop the insulating material in the lower pattern density region, shown in the right side of FIG. 2B.

Figure 2C:
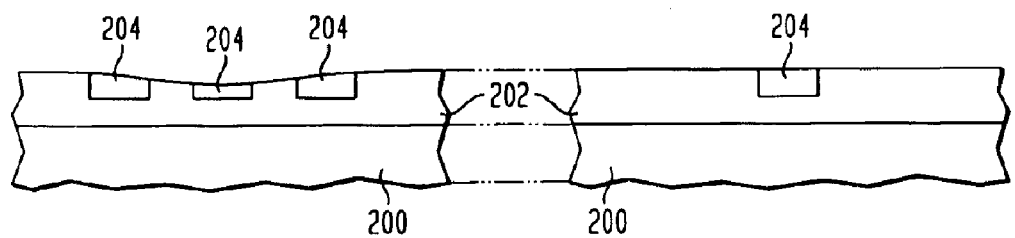

To remove the remaining overlying conducting material in the lower pattern density region, as shown in the right portion of FIG. 2C, the higher pattern density region must be overpolished. The overpolishing removes a portion of the insulating material, as well as part of the conducting material that fills the openings in the insulating material and causes "dishing," shown in the left portion of FIG. 2C.

The thinner conductor lines that are created by the dishing can adversely affect the electrical properties of the devices. Moreover, in certain portions of the wafer, some or all of the conductor lines may be removed in the higher pattern density regions.

The present invention provides a process in which a wafer is planarized in both the higher and lower pattern density regions without excessive pattern erosion.

Figure 3A:
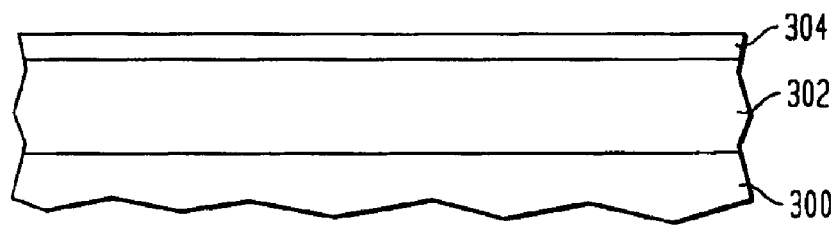
FIGS. 3A–3D illustrate the steps of a process that includes a CMP step in accordance with the invention.

FIGS. 3A–3D illustrate a process in accordance with the invention. First, as FIG. 3A shows, a layer of insulating material 302, such as TEOS or silicon dioxide, is deposited atop a substrate 300 which includes one or more devices formed therein. Then, a dielectric liner layer 304, such as silicon nitride (SiN) is deposited atop the insulating layer 302, typically with a thickness of about 20 nm. Typically, a nitride layer is deposited atop an oxide-type layer to provide etching selectively between the two layers. An optional p-type silicon hard mask layer (not shown) may be deposited atop the second insulating layer.

Figure 3B:
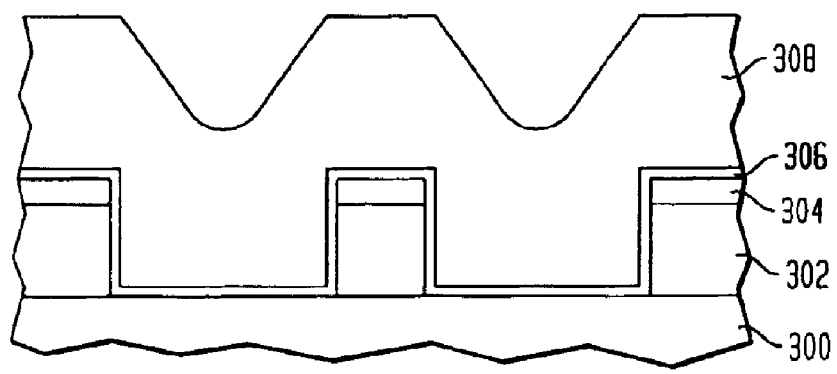

Then, as FIG. 3B shows, a resist layer (not shown) is deposited atop the second insulating layer, and portions of the resist layer are exposed, such as using photolithography, x-ray lithography, electron beam lithography, or ion beam lithography. The resist layer is then developed, and the exposed portions of the resist are removed when positive resist is used and the unexposed portions of the resist are removed when negative resist is used. Next, the remaining portions of the resist layer are used to mask an etching step, such as using reactive ion etching (RIE), other isotropic or anisotropic plasma etching or wet etching. The portions of the two insulating layers that are exposed by the openings in the resist layer are thus removed. Thereafter, a liner layer 306 is deposited atop the nitride layer as well as along the sidewalls and the bottoms of the openings in the nitride and oxide layers. Typically, the liner layer serves as an adhesion layer and may be tantalum nitride (TaN), titanium nitride (TiN) or tungsten nitride (WN), depending on the conducting material that is to be subsequently deposited. Thereafter, a layer of conducting material 308 is deposited to fill the openings in the oxide and nitride layers using a known method, such as sputtering. The conducting layer 308 also extends above the tops of the openings and atop the nitride layer. The conductor layer is typically tungsten (W) though other refractory metals, such as tantalum (Ta) or titanium (Ti), or a non-refractory metal, such as copper (Cu) may be used.

Thereafter, a chemical mechanical polishing step (CMS) is carried out in accordance with the invention. In place of a rotating table having a polishing pad that is used in the known CMP process, an abrasive polishing pad is used in which abrasive particles are embedded in the pad and held in place using an adhesive. A chemical solution that includes an etchant for the tungsten or other conducting material is fed onto the platen during the CMP step. Typically, the chemical solution includes an oxidizer, such as ferric nitrate or hydrogen peroxide, and a pH buffer, such as phosphoric acid. The invention, however, is not limited to an abrasive-free CMP step, i.e. to polishing only with abrasives that are fixed on the pad. Rather, a regular slurry may be used in conjunction with the abrasive pad. The preferred method, however, is to polish without any abrasives in the etchant solution.

The chemical etchant solution, when used in conjunction with the fixed abrasive pad, enables all of the overlying conducting material to be removed from the wafer in both the higher and lower pattern density regions of the wafer without any dishing, namely without any erosion of the patterns in the higher pattern density regions.

Figure 3C:
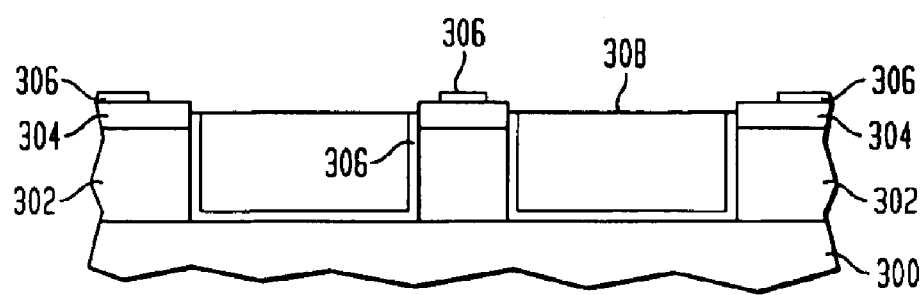

As FIG. 3C shows, the CMP step removes all of the tungsten or other conducting material that is atop the liner layer 306 and atop the nitride layer 304 and removes the portion of the conducting layer 308 that extends above the top of the openings in the oxide layer 302 and nitride layer 304. Further erosion using the CMP step of the invention is prevented by the liner layer, which is removed in part, and by the nitride layer.

Figure 3D:
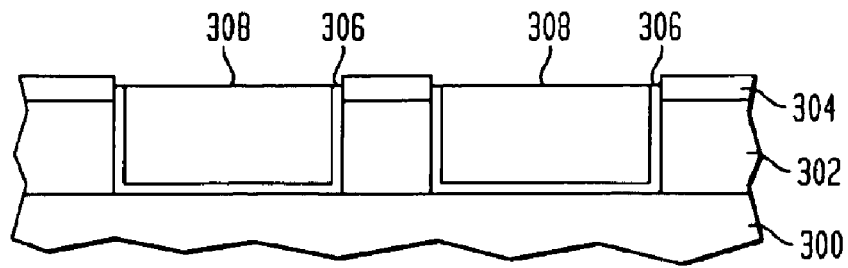

Thereafter, a further CMP step is carried out using the chemical solution of the invention that removes the liner layer, as shown in FIG. 3D, without further eroding the tungsten or other metal material 308 that remains in the openings in the insulating layer.

Table 1 shows the erosion measured in a tungsten conductor layer using the method of the invention and the measured erosion in a tungsten conductor layer using the known CMP process. The amount of tungsten erosion is measured at various locations across the wafer starting from the center of the wafer and moving outward to the edge of the wafer. The CMP step was stopped and measurements taken as soon as the tungsten overburden, namely the portion of the tungsten layer that is atop the insulating and liner layers, is removed. As shown, less tungsten is eroded using the method of the invention than using the known process. Specifically, the known process removes between 298 to 848 Angstroms of tungsten from the top of the metal line, whereas the process of the invention removes no more than 240 Angstroms of tungsten from the top of the metal line.

Further, sets of wafers were processed using a CMP step with an additional 30 seconds of polishing. Using the known process, a significant additional amount of tungsten is removed whereby as much as approximately 800 Angstroms of tungsten may be removed at the edge of the wafer. By contrast, using the process of the invention, the 30 second overpolishing removes only about an additional 50 Angstroms of tungsten across the wafer.

Thus, the process of the invention causes less erosion of the conducting material in the openings in the insulating layer, and significantly reduces erosion during overpolishing.

The process of the invention may be carried out using a known slurry chemistry in addition to the etchant solution. Further, the overlying conducting layer and the overlying liner layer may be removed in a single CMP step.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

TABLE

| Measurement sites (proceeding from wafer center to wafer edge) | Known CMP Process, after removal of W overburden | Invention CMP Process, after removal of W overburden | Known CMP Process, with additional 30 second overpolish | Invention CMP Process, with additional 30 second overpolish |
|---|---|---|---|---|
| 1 (wafer center) | 458 Å | 200 Å | 1,000 Å | 246 Å |
| 2 | 510 Å | 231 Å | 1,116 Å | 245 Å |
| 3 | 298 Å | 207 Å | 854 Å | 271 Å |
| 4 | 537 Å | 165 Å | 1,087 Å | 293 Å |
| 5 (wafer edge) | 848 Å | 240 Å | 1,627 Å | 303 Å |

What is claimed is:

1. A method of polishing a semiconductor wafer having a lower layer formed atop a substrate and having a layer of conductive material formed atop said lower layer, said method comprising:
   rotating said semiconductor wafer against an abrasive polishing pad;
   applying a solution to said semiconductor wafer and to said abrasive polishing pad, concurrent with said rotating of said semiconductor wafer, to remove part of said layer of conductive material selectively with respect to said lower layer, said solution including an etchant of said conductive material; said layer of conductive material being selected from the group consisting of tungsten (W), copper (Cu), tantalum (Ta), and titanium (Ti); said lower layer being selected from the group consisting of tantalum nitride (TaN), titanium nitride (TiN) and tungsten nitride (WN); and
   applying a slurry to said semiconductor wafer and to said abrasive polishing pad concurrent with said applying of said solution.

2. The method of claim 1 wherein said solution includes an oxidizer and a pH buffer.

3. The method of claim 2 wherein said oxidizer includes hydrogen peroxide.

4. The method of claim 2 wherein said pH buffer comprises phosphoric acid.

5. The method of claim 2 wherein said oxidizer includes ferric nitrate.

6. A method of fabricating a semiconductor device structure on a semiconductor wafer, said method comprising:
   depositing at least one dielectric layer atop a substrate;
   patterning and etching said dielectric layer to form at least one opening therein;
   depositing a liner layer atop said dielectric layer and along a bottom and sidewalls of said opening, said liner layer material being selected from the group consisting of tantalum nitride (TaN), titanium nitride (TiN) and tungsten nitride (WN);
   depositing a conductor layer atop said liner layer that completely fills and extends above said opening, said conductor layer being selected from the group consisting of tungsten (W), copper (Cu), tantalum (Ta), and titanium (Ti); and
   polishing said conductor layer, said polishing step comprising:
   rotating said semiconductor wafer against an abrasive polishing pad,
   applying a solution to said semiconductor wafer and to said abrasive polishing pad, concurrent with said rotating of said semiconductor wafer, to remove a portion of said conductor layer that extends outside said opening and a portion of said conductor layer that extends above said opening selectively with respect to said liner layer, said solution including an etchant of said conductor layer; and
   applying a slurry to said semiconductor wafer and to said abrasive polishing pad concurrent with said applying of said solution.

7. The method of claim 6 wherein said patterning and etching step forms a plurality of openings in said dielectric layer, and said polishing step removes a portion of said conductor layer that extends outside etch of said plurality of openings and a portion of said conductor layer that extends above each of said plurality of openings selectively with respect to said liner layer while leaving a further portion of said conductor layer in each of said plurality of openings.

8. The method of claim 7 wherein said plurality of openings includes a first group of said plurality of openings and a second group of said plurality of openings, said opening in said first group being spaced more closely together than said openings in said second group, and said polishing step removes a portion of said conductor layer that extends outside each of said first group of said plurality of openings and a portion of said conductor layer that extends outside each of said second group of said plurality of openings selectively with respect to said liner layer while leaving said further portion of said conductor layer in each of said first group and said plurality of openings and in each of said second group of said plurality of openings.

9. The method of claim 6 wherein said polishing step includes polishing said wafer for a period of time after said portion of said conductor layer that extends outside said opening and said portion of said conductor layer that extends above said opening are removed while leaving a further portion of said conductor layer in said opening.

10. The method of claim 6 further comprising further polishing said wafer, after said polishing of said conductor layer, to remove a portion of said liner layer that extends outside said opening while leaving a further portion of said conductor layer in said opening.

11. The method of claim 6 wherein said dielectric layer comprises an oxide layer and a nitride layer.

12. The method of claim 6 wherein said opening in said dielectric layer comprises a channel opening, and said polishing step leaves a further portion of said conductor layer in said channel opening to form a conductive line.

13. The method of claim 6 wherein said opening in said dielectric layer comprises a via opening, and said polishing step leaves a further portion of said conductor layer in said via opening to form a conductive contact.

14. The method of claim 6 wherein said solution includes an oxidizer and a pH buffer.

15. The method of claim 14 wherein said oxidizer includes hydrogen peroxide.

16. The method of claim 14 wherein said pH buffer comprises phosphoric acid.

17. The method of claim 14 wherein said oxidizer includes ferric nitrate.

18. A method of polishing a semiconductor wafer having a lower layer formed atop a substrate and having a layer of conductive material formed atop said lower layer, said method comprising:

rotating said semiconductor wafer against an abrasive polishing pad;

applying a solution to said semiconductor wafer and to said abrasive polishing pad, concurrent with said rotating of said semiconductor wafer, to remove part of said layer of conductive material selectively with respect to said lower layer; said solution including an etchant of said conductive material having an oxidizer and a pH buffer, said oxidizer including ferric nitrate, said pH buffer including phosphoric acid; said layer of conductive material being selected from the group consisting of tungsten (W), copper (Cu), tantalum (Ta), and titanium (Ti); said lower layer being selected from the group consisting of tantalum nitride (TaN), titanium nitride (TiN) and tungsten nitride (WN); and applying a slurry to said semiconductor wafer and to said abrasive polishing pad concurrent with said applying of said solution.

19. A method of fabricating a semiconductor device structure on a semiconductor wafer, said method comprising:

depositing at least one dielectric layer atop a substrate;

patterning and etching said dielectric layer to form at least one opening therein;

depositing a liner layer atop said dielectric layer and along a bottom and sidewalls of said opening, said liner layer material being selected from the group consisting of tantalum nitride (TaN), titanium nitride (TiN) and tungsten nitride (WN);

depositing a conductor layer atop said liner layer that completely fills and extends above said opening, said conductor layer being selected from the group consisting of tungsten (W), copper (Cu), tantalum (Ta), and titanium (Ti); and polishing said conductor layer; said polishing step comprising:

rotating said semiconductor wafer against an abrasive polishing pad, applying a solution to said semiconductor wafer and to said abrasive polishing pad, concurrent with said rotating of said semiconductor wafer, to remove a portion of said conductor layer that extends above said opening selectively with respect to said liner layer; said solution including an etchant of said conductor layer having an oxidizer and a pH buffer, said oxidizer including ferric nitrate, said pH buffer including phosphoric acid; and applying a slurry to said semiconductor wafer and to said abrasive polishing pad concurrent with said applying of said solution.

* * * * *